United States Patent [19]

Smart

[11] 4,376,274

[45] Mar. 8, 1983

[54] PRINTED CIRCUIT TRANSFORMERS

[75] Inventor: Daniel H. Smart, Morden, England

[73] Assignee: Communications Patents Limited, London, England

[21] Appl. No.: 306,601

[22] Filed: Sep. 29, 1981

[30] Foreign Application Priority Data

Oct. 1, 1980 [GB] United Kingdom ................. 8031656

[51] Int. Cl.³ ............................................. H01F 27/28
[52] U.S. Cl. .................................... 336/183; 336/200; 336/232
[58] Field of Search ................ 336/200, 232, 180, 183

[56] References Cited

FOREIGN PATENT DOCUMENTS 2230587 4/1980 Fed. Rep. of Germany ...... 336/200
54-110424 8/1979 Japan ................................... 336/200

Primary Examiner—Thomas J. Kozma
Attorney, Agent, or Firm—Laurence R. Brown

[57] ABSTRACT

A printed circuit transformer comprises one primary track and two secondary tracks, the three tracks being located adjacent and substantially parallel to each other with one side of one of the secondary tracks and the other secondary track being connected to a common source of potential. The primary track is located between the secondary tracks and all the tracks are printed wholly on one side of the circuit board.

2 Claims, 5 Drawing Figures

PRINTED CIRCUIT TRANSFORMERS

The present invention relates to printed circuit transformers.

It is known to provide broad band mixer transformers for use in VHF applications by forming one primary and two series connected secondary tracks on a circuit board, the secondary tracks being immediately adjacent each other with the primary track to one side of them. Such printed circuit transformers may be made particularly compact. However, the configuration of the primary and secondary tracks used in these known printed circuit transformers requires the use of double sided circuit boards in order to provide for the fabrication of a cross-over connection in one of the secondary tracks. This in turn requires the provision of plated through holes to provide connections between the two sides of the board. The use of double sided circuit boards is expensive because of the difficulty in registering accurately the printed tracks on each side of the board, and the provision of plated through holes adds a further large element to their cost. A further disadvantage experienced with this known configuration arises from the fact that the secondary track which includes the cross-over connection differs in inductance and stray capacitance from the secondary track which is printed wholly on one side of the board. Since the two secondary tracks are not identical this can make it difficult to balance the output of the transformer.

It is an object of the present invention to provide a printed circuit transformer wherein the above mentioned problems may be obviated or mitigated.

According to the present invention there is provided a printed circuit transformer comprising one primary track and two secondary tracks, the three tracks being located adjacent and substantially parallel to each other with one end of one of the secondary tracks and the other end of the other secondary track being connected to a common source of potential, characterised in that the primary track is located between the secondary tracks and all the tracks are printed wholly on one side of the circuit board.

The common source of fixed potential effectively form a centre tapping on the secondary defined by the two secondary tracks. Thus a balanced output can be derived from the secondary tracks.

Preferably the secondary tracks are connected to a common printed conductive area which is maintained at the said potential, the printed conductive area extending to adjacent the ends of all the tracks. The printed conductive area also extends parallel to at least a proportion of each of the secondary tracks such that an elongate gap is defined between the printed conductive area and at least part of the length of each secondary track. The effective length of one or both of the secondary tracks may be reduced to trim the transformer by bridging a portion of the gap between that track and the printed conductive area with a conductive material.

An embodiment of the present invention will now be described, by way of example, with reference to the accompanying drawings, in which.

Figure 1:
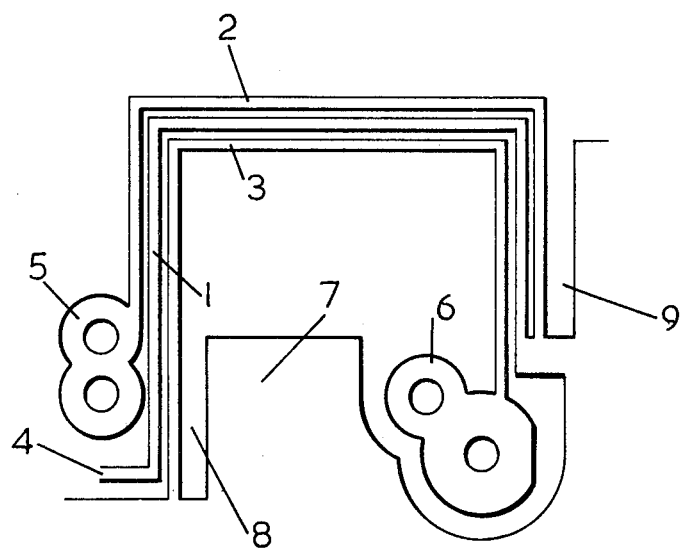
FIG. 1 shows a printed circuit transformer embodying the present invention.

Referring to FIG. 1 there is shown a printed circuit broad band mixer transformer comprising a primary track 1 and two secondary tracks 2, 3. The primary track 1 is located equidistant from the tracks 2 and 3 which ensures that coupling between the primary track and each secondary track 2, 3 is equal. Connection to the primary track 1 is provided through a contact (not shown) to which the left hand end 4 of the primary track extends, and to the secondary tracks 2 and 3 through contacts 5 and 6. The other ends of all the tracks are connected to a common printed area 7 which is maintained at earth potential.

The area 7 extends parallel to at least a proportion of each of the secondary tracks 2, 3 to define gaps 8, 9. The effective lengths of the secondary tracks can be reduced by bridging the gaps 8, 9 with solder.

This arrangement of tracks enables the whole of the transformer to be printed on one side of the circuit board. The transformer may be easily trimmed for best balance and return loss ratio (matching to the load) simply by connecting solder bridges across the gaps 8, 9. Since the frequency of operation of the transformer is not determined by the length of the tracks the transformer may be made as compact as required, regardless of the operating frequency.

The connection of solder bridges across the gaps 8, 9 to trim the transformer is only necessary when exceptionally close balance is required. Normally the necessary lengths of the secondary tracks which are decided upon during development for a particular application could be reproduced with sufficient accuracy by standard printed circuit production methods.

Figure 2:
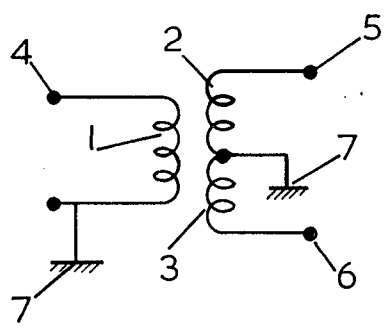
FIG. 2 is a schematic circuit diagram of the transformer of FIG. 1.

FIG. 2 shows a schematic circuit diagram of the printed circuit transformer of FIG. 1. The primary and secondary of the transformer and their connections have been given the same reference numbers as in FIG. 1.

The transformer according to the invention can be usefully applied to a broad band high power VHF amplifier as used in C.A.T.V. systems. Such amplifiers may comprise a pre-amplifier the stages of which are all of single-ended configuration and a high power amplifier the stages of which are all of push-pull configuration.

The high amplifier requires an input transformer and an output transformer, both of which may be transformers in accordance with the present invention.

Figure 3:
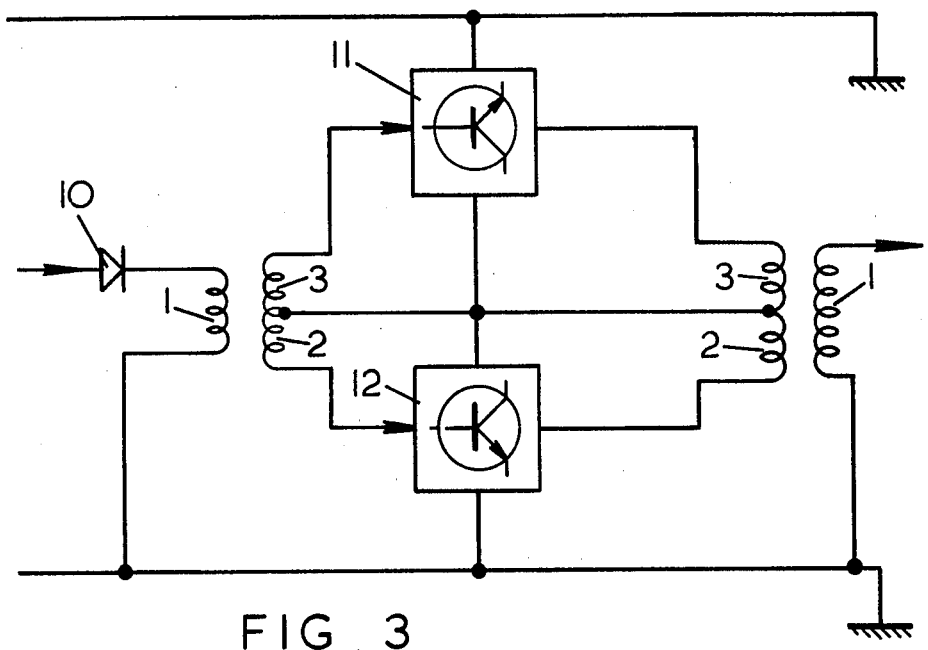
FIG. 3 illustrates the use of transformers according to the invention in a VHF amplifier.

Referring to FIG. 3, a high power push-pull amplifier is schematically illustrated. The output of a single-ended pre-amplifier is applied via diode 10 to the primary winding 1 of a transformer of the type described with reference to FIG. 1. The outputs of the transformer secondaries 2 and 3 are applied to respective sides of a push-pull transistor amplifier stage represented schematically by boxes 11 and 12. The configuration of the push-pull stage is conventional and therefore is not shown in detail. Furthermore, although only one push-pull stage is shown, in practice there will be for example four stages.

The outputs of the stage 11 and 12 are applied to the centre tapped winding 2, 3 of a further transformer of the type described with reference to FIG. 1, the amplifier output being taken from winding 1.

The use of an output transformer in accordance with the invention makes it possible to avoid providing feedback networks between the last push-pull stage of the amplifier and the output transformer. Such feedback networks are provided in prior art systems. It is highly advantageous to dispense with such feedback networks in VHF systems as it is very difficult to control the phase changes of signals passing through them.

Figure 4:
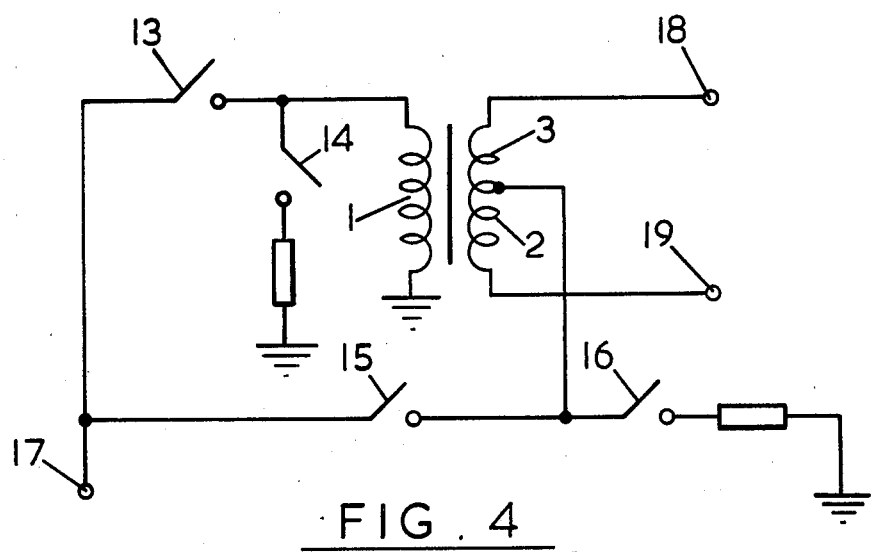
FIGS. 4 and 5 illustrate the use of a transformer according to the invention to provide signals with a phase difference of 180° in a measuring instrument.
Figure 5:
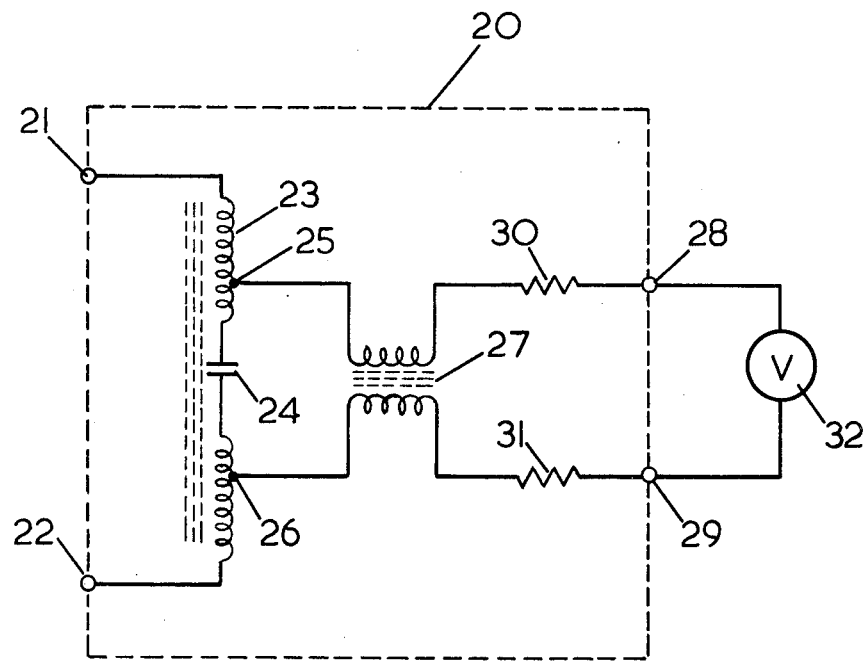

Referring now to FIGS. 4 and 5, a further example of an application of the transformer according to the invention will be described. FIG. 4 shows part of the circuit diagram of an automatic test apparatus for measuring the goodness of balance of subscriber's inserts used in cable television. These inserts comprise transformers and impedance networks by which subscriber's receivers are isolated from the cable network so as to minimise mutual interference and minimise the transference of impedance imperfections from the receiver to the network. A measure of the balance of the insert is derived from the ratio of the output voltage it gives when it has applied to it (i) a push-pull signal, and (ii) a push-push signal.

The testing apparatus is arranged to provide such signals by using a transformer in accordance with the present invention as described with reference to FIG. 1 in conjunction with a switching arrangement comprising relays controlling contacts 13, 14, 15 and 16. With contacts 13 and 16 closed, a push-pull output is obtained, whereas with contacts 14 and 15 closed a push-push output is obtained. The signal applied to input terminal 17 may be a carrier wave or an amplitude or frequency modulated wave depending upon the characteristics of the detector employed which is described below. The output terminals 18, 19 are connceted to the insert under test.

The insert and detector to which the signals from the arrangement of FIG. 4 are applied is shown in FIG. 5. The test signals from terminals 18, 19 of FIG. 4 are applied to the insert 20 via terminals 21, 22. The insert comprises an autotransformer 23, the winding being interrupted at the centre to allow the insertion of a capacitor 24, the capacitance of which (about 2000pF) is chosen to present a high impedance at audio frequencies and a low impedance at the radio frequencies over which it is designed to operate. This capacitor 24 is necessary because T.V. signal cables also carry audio programmes at a level of for example 55 volts. If any appreciable part of these audio signals were allowed to flow through the winding 23 its ferrite core would be magnetically saturated and it would cease to act as a transformer.

The selected signal level to be provided to the subscriber is determined by the output tapping points 25 and 26 on the transformer 23. The tapped portion of the signal is passed through a bifilar choke 27, the purpose of which is to minimise push-push current at the output terminals 28, 29, i.e. to improve the balance of the device. Resistors 30 and 31 are equal in value and substantially define the output impedance of the insert.

In order to carry out the balance test, it is necessary to measure the voltage appearing at the terminals 28 and 29. A voltmeter 32 is shown which may be a sensitive valve voltmeter or a measuring receiver, i.e. a communications receiver with a calibrated detector voltage. In the case where an amplitude or frequency modulated wave is applied to the terminal 17 of FIG. 4, the audio output terminals of the communications receiver may be applied to an audio millivoltmeter to indicate the measured quantity.

The balance of the insert 20 is measured by applying a balanced signal from the circuit of FIG. 4 (push-pull) to the terminals 21 and 22 and noting the output registered by the voltmeter 32. Unbalanced signals are then applied from the circuit of FIG. 4 (push-push) to the terminals 21 and 22 and the lower output noted. The ratio of the two output voltages, expressed in decibels, is a measure of the balance of the insert.

What is claimed is:

1. A printed circuit transformer comprising one primary track and two secondary tracks, the three tracks being located adjacent and substantially parallel to each other with one end of one of the secondary tracks and the other end of the other secondary track being connected to a common source of potential, characterised in that the primary track is located between the secondary tracks and all the tracks are printed wholly on one side of the circuit board.

2. A printed circuit transformer according to claim 1, characterised in that the secondary tracks are connected to a common printed conductive area extending to adjacent the ends of all of the tracks, the printed conductive area also extending parallel to at least a proportion of each of the secondary tracks such that an elongate gap is defined between the printed conductive area and at least part of the length of each secondary track, whereby the effective length of one or both of the secondary tracks may be reduced by bridging a portion of the gap between that track and the printed conductive area with a conductive material.

* * * * *